(12) United States Patent
Sato et al.

(10) Patent No.: US 8,081,402 B2
(45) Date of Patent: Dec. 20, 2011

(54) MAGNETORESISTIVE HEAD HAVING A CURRENT SCREEN LAYER FOR CONFINING CURRENT THEREIN AND METHOD OF MANUFACTURE THEREOF

(75) Inventors: Yo Sato, Kanagawa (JP); Katsumi Hoshino, Kanagawa (JP); Hiroyuki Hoshiya, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1055 days.

(21) Appl. No.: 11/998,623

(22) Filed: Nov. 29, 2007

(65) Prior Publication Data

US 2008/0144231 A1 Jun. 19, 2008

(30) Foreign Application Priority Data

Dec. 15, 2006 (JP) .................................. 2006-338153

(51) Int. Cl.
*G11B 5/39* (2006.01)
(52) U.S. Cl. .................................................... 360/324.1
(58) Field of Classification Search .................. 360/324, 360/324.1, 324.11, 324.12
See application file for complete search history.

(56) References Cited

U.S. PATENT DOCUMENTS

| | | | |
|---|---|---|---|
| 5,715,121 A | 2/1998 | Sakakima et al. | |
| 6,560,077 B2 * | 5/2003 | Fujiwara et al. | 360/324.1 |
| 6,707,649 B2 * | 3/2004 | Hasegawa et al. | 360/324.12 |
| 6,937,446 B2 * | 8/2005 | Kamiguchi et al. | 360/324.1 |
| 7,002,781 B2 * | 2/2006 | Sugawara | 360/324.11 |
| 7,038,893 B2 | 5/2006 | Koui et al. | |
| 7,050,276 B2 * | 5/2006 | Nishiyama | 360/324.11 |
| 7,173,797 B2 * | 2/2007 | Sbiaa | 360/324.11 |
| 7,180,713 B2 * | 2/2007 | Nagasaka et al. | 360/324.1 |
| 7,206,174 B2 * | 4/2007 | Sbiaa et al. | 360/324.1 |
| 7,236,335 B2 * | 6/2007 | Sbiaa et al. | 360/324.1 |
| 7,304,825 B2 * | 12/2007 | Funayama et al. | 360/324 |
| 7,308,751 B2 * | 12/2007 | Kagami et al. | 29/603.07 |
| 7,312,961 B2 * | 12/2007 | Kagami et al. | 360/324.2 |
| 7,372,271 B2 * | 5/2008 | Roozen et al. | 324/318 |
| 7,372,672 B2 * | 5/2008 | Nishiyama | 360/324.11 |
| 7,405,906 B2 * | 7/2008 | Funayama et al. | 360/314 |
| 7,423,847 B2 * | 9/2008 | Carey et al. | 360/324.1 |
| 7,423,851 B2 * | 9/2008 | Sbiaa | 360/324.2 |
| 7,433,161 B2 * | 10/2008 | Ikarashi et al. | 360/324.11 |
| 7,514,117 B2 * | 4/2009 | Fukuzawa et al. | 427/127 |
| 7,514,916 B2 * | 4/2009 | Funayama et al. | 324/210 |

(Continued)

FOREIGN PATENT DOCUMENTS

EP 1400957 A2 * 3/2004

(Continued)

*Primary Examiner* — Brian Miller
(74) *Attorney, Agent, or Firm* — Zilka-Kotab, PC

(57) ABSTRACT

Embodiments of the present invention provide a magnetic head incorporating a CPP-GMR device having a high output at a suitable resistance. According to one embodiment, in a Current Perpendicular to Plane-Giant Magneto Resistive (CPP-GMR) head comprising a pinned layer, a free layer, and a current screen layer for confining current therein, a planarization treatment is applied to the surface of the current screen layer, thereby allowing the current screen layer to have a fluctuation in film thickness thereof. As a result of the fluctuation being provided in the film thickness of the current screen layer, parts of the current screen layer, smaller in the film thickness, will be selectively turned into metal areas low in resistance, and as the metal areas low in resistance serve as current paths, effects of confining current can be adjusted by controlling the fluctuation in the film thickness.

10 Claims, 11 Drawing Sheets

U.S. PATENT DOCUMENTS

| | | | |
|---|---|---|---|
| 7,522,390 B2* | 4/2009 | Yuasa et al. | 360/324.1 |
| 7,538,987 B2* | 5/2009 | Fujiwara et al. | 360/324.1 |
| 7,561,384 B2* | 7/2009 | Osugi et al. | 360/324.1 |
| 7,646,570 B2* | 1/2010 | Gill et al. | 360/324.2 |
| 7,697,245 B2* | 4/2010 | Hoshiya et al. | 360/324.1 |
| 2003/0011945 A1* | 1/2003 | Yuasa et al. | 360/324.1 |
| 2003/0128481 A1* | 7/2003 | Seyama et al. | 360/324.1 |
| 2004/0042127 A1* | 3/2004 | Hoshiya et al. | 360/322 |
| 2004/0169963 A1* | 9/2004 | Okuno et al. | 360/324.1 |
| 2004/0240124 A1* | 12/2004 | Sbiaa | 360/324.11 |
| 2005/0063104 A1* | 3/2005 | Takagishi et al. | 360/324.2 |
| 2005/0094317 A1* | 5/2005 | Funayama | 360/313 |
| 2006/0023376 A1* | 2/2006 | Gill | 360/324.12 |
| 2006/0023494 A1* | 2/2006 | Jeong et al. | 365/158 |
| 2006/0202244 A1* | 9/2006 | Ju et al. | 257/295 |
| 2006/0221484 A1* | 10/2006 | Funayama | 360/66 |
| 2007/0223150 A1* | 9/2007 | Fukuzawa et al. | 360/324.11 |
| 2008/0106826 A1* | 5/2008 | Funayama et al. | 360/314 |
| 2008/0144231 A1* | 6/2008 | Sato et al. | 360/324 |
| 2008/0311431 A1* | 12/2008 | Fuji et al. | 428/836 |
| 2009/0034135 A1* | 2/2009 | Hoshiya et al. | 360/324.12 |
| 2009/0091865 A1* | 4/2009 | Zhang et al. | 360/324.12 |

FOREIGN PATENT DOCUMENTS

| | | |
|---|---|---|
| JP | 2003-293437 | 10/2003 |
| JP | 2003-298143 | 10/2003 |
| JP | 2006-338153 | 12/2006 |

* cited by examiner

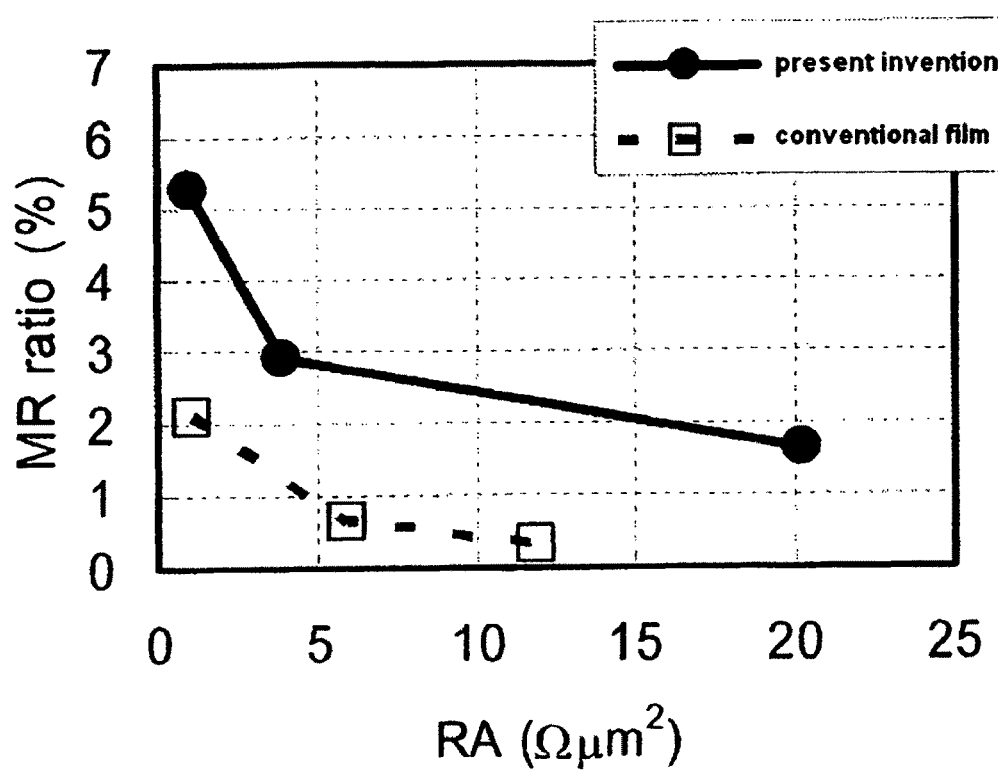

(prior art)

MAGNETORESISTIVE HEAD HAVING A CURRENT SCREEN LAYER FOR CONFINING CURRENT THEREIN AND METHOD OF MANUFACTURE THEREOF

CROSS-REFERENCE TO RELATED APPLICATION

The instant nonprovisional patent application claims priority to Japanese Patent Application No. 2006-338153 filed Dec. 15, 2006 and which is incorporated by reference in its entirety herein for all purposes.

BACKGROUND OF THE INVENTION

As magnetic recording density has become higher, a spin-valve type giant magnetoresistive head has been used for a read head of an HDD (Hard Disk Drive) output signal of the read head has been increasing along with improvement on film structure. The spin-valve type giant magnetoresistive head has the film structure in which an antiferromagnetic layer, a ferromagnetic layer, a non-magnetic intermediate layer, and a soft magnetic free layer are deposited in that order. As magnetization of the ferromagnetic layer is pinned by an exchange coupling field occurring to an interface between the antiferromagnetic layer, and the ferromagnetic layer while magnetization of the soft magnetic free layer is reversed by an external field, relative orientations of the magnetization of the two magnetic layers are changed according to the external field, thereby causing electric resistance to undergo a change, so that a magnetic field is detected from the change in the electric resistance. In this case, current flows in a direction parallel to a film plane. This method for causing current to flow in the direction parallel to the film plane is generally called the CIP (Current-in-Plane) method.

In order to achieve a further output, research and development has lately been conducted on the CPP (Current Perpendicular to Plane)-GMR (Giant Magneto Resistive) head for causing current to flow in a direction perpendicular to the film plane, and a TMR (Tunneling Magneto Resistive) head. The TMR head features a high magnetoresistance ratio as it exhibits magnetoresistance by making use of a spin-dependent tunneling effect. Despite that the magnetoresistance ratio is large, a resistance area product (RA) is as large as several $\Omega/\mu m^2$. Accordingly, when a device becomes small in size, a head resistance increases, so that high-frequency characteristics are poor, thereby the TMR head has a disadvantage for fast transfer. Meanwhile, with the CPP type head, a proposal has been made on an artificial lattice type magnetoresistive device where a magnetic layer and a non-magnetic layer are deposited one after another. With the artificial lattice magnetoresistive device, because of a high probability of a sense current cutting across an interface between the magnetic layer and the non-magnetic layer, it is possible to obtain a large magnetoresistance ratio proportional to a probability of interface scattering. On the other hand, however, in the case where the CPP artificial lattice type magnetoresistive device is used for the head, it is necessary to decrease Mst (magnetization× total film thickness of a free layer) of a magnetic free layer in order to render the device highly sensitive to the external field. In the case of the artificial lattice magnetoresistive device, however, it is required that the magnetic layer and the non-magnetic layer should be alternately deposited many times in order to increase a resistance, which causes Mst to increase. In consequence, it becomes difficult to enhance sensitivity to the external field.

As another structure of a spin-valve structure, a proposal has been made on the CPP-GMR device for causing current to flow in the direction perpendicular to the film plane. With this structure, the total film thickness of the free layer is decreased as compared with the artificial lattice type device, so that higher sensitivity to the external field can be expected. Nevertheless, there exists a problem that a decrease in the number of the interfaces between the magnetic layer and the non-magnetic layer will result in a decrease in the magnetoresistance ratio. Further, the CPP-GMR device has a drawback in that RA of the device is low because the same in its entirety is formed of metal films, and unless the device is processed fairly small to thereby increase the head resistance thereof, it is not possible to obtain a sufficient output.

In this connection, in Japanese Patent Application No. 3293437, there has been proposed a magnetoresistive device with a non-magnetic film made up of a mixture of an insulator and an electrical conductor, inserted therein. Further, in connection with specific formation of a non-magnetic film, and method for manufacturing the same, in Japanese Patent Application No. 2003-298143, there has been proposed a method whereby an alloy made of not less than two kinds of elements is caused to undergo solid-solid phase segregation by use of a mechanism, such as spinodal decomposition, formation of a GP zone, and so forth, thereby preferentially causing one of the elements to undergo oxidation. Thus, with the spin-valve structure, as a result of the formation of a layer made up of a composite of the insulator and the electric conductor, the current flowing in the direction perpendicular to the film plane preferentially flows through an electrically conducting region of the non-magnetic film, so that it is possible to increase the device resistance and magnetoresistance ratio of the device.

The spin-valve type CPP-GMR head has a problem in that the magnetoresistance ratio thereof is still too small to achieve an areal density of the next generation, at 100 odd Gbits/in², and the sensitivity of the magnetoresistive device is insufficient.

BRIEF SUMMARY OF THE INVENTION

Embodiments of the present invention provide a magnetic head incorporating a CPP-GMR device having a high output at a suitable resistance. According to the particular embodiment disclosed in FIG. 1, in a CPP-GMR head comprising a pinned layer 114, a free layer 117, and a current screen layer 116 for confining current therein, a planarization treatment is applied to the surface of the current screen layer 116, thereby allowing the current screen layer 116 to have a fluctuation in film thickness thereof. As a result of the fluctuation being provided in the film thickness of the current screen layer, parts of the current screen layer, smaller in the film thickness, will be selectively turned into metal areas low in resistance, and as the metal areas low in resistance serve as current paths, effects of confining current can be adjusted by controlling the fluctuation in the film thickness.

BRIEF DESCRIPTION OF THE DRAWINGS

FIG. 3 is a view showing a relationship between an RA and a magnetoresistance ratio with respect to the CPP-GMR device according to embodiments of the present invention, and the CPP-GMR device according to the comparative example.

FIGS. 5(a) and 5(b) show schematic diagrams indicating distribution of oxygen concentration in the current screen layer, in which FIG. 5(a) is the schematic diagram for the current screen layer according to embodiments of the present invention, and FIG. 5(b) is the schematic diagram for the conventional current screen layer.

FIGS. 11(a) and 11(b) are schematic diagrams of a hard disk drive, in which FIG. 11(a) is a plane schematic diagram of the hard disk drive, and FIG. 11(b) is a sectional schematic diagram of the hard disk drive, taken on line A-A of FIG. 11(a).

DETAILED DESCRIPTION OF THE INVENTION

Figure 1A:
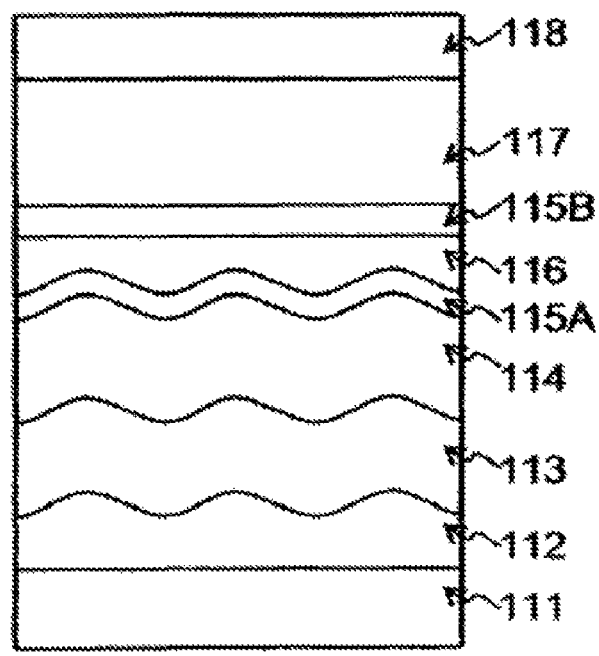
FIG. 1(a) is a schematic diagram showing a CPP-GMR device according to embodiments of the present invention.

Embodiments of the present invention relate to a magnetic head capable of coping with a high areal recording density, a method of manufacturing the same, and magnetic storage apparatus.

An object of embodiments of the present invention is to provide a magnetic head incorporating a CPP-GMR device high in magnetoresistance ratio, highly sensitive, and suitable for high areal density recording, a method for manufacturing the same, and a magnetic storage apparatus.

With the CPP-GMR head using a current screen layer, if resistance in parts of the current screen layer, generating magnetic resistance, is rendered relatively higher, this will enable a suitable resistance, and a high magnetoresistance ratio to be achieved. In the current screen layer, low resistance areas where current is liable to locally flow with ease are formed in parts of high resistance areas composed of insulator phases, thereby confining current to the low resistance areas. Accordingly, in order to control a RA, and the magnetoresistance ratio of the CPP-GMR head, it is important to control formation of the low resistance areas.

In accordance with one aspect of embodiments of the invention, there is provided a magnetic head comprising a pinned layer with a direction of magnetization thereof, effectively pinned in one direction, a free layer with a direction of magnetization thereof, undergoing a change according to an external field, and a current screen layer for confining current therein, wherein the current screen layer has respective parts relatively large and small, in film thickness, in the direction of the normal to a film plane, and a sense current is caused to pass in a direction substantially perpendicular to the film plane. Further, the current screen layer may be provided in the pinned layer, or over the free layer besides between the pinned layer, and the free layer.

To describe a specific makeup example, depressions and projections, attributable to a grain size and structure, are formed on an under layer of the current screen layer, and depressions and projections, in the upper part of the current screen layer, are reduced in size to be flattened with the use of a method of reverse sputtering, IBE (Ion Beam Etching), or GCIB (Gas Cluster Ion Beam) etching, and so forth, so that fluctuation in film thickness, in sync with a cycle of change in grain size, is formed. In this process step, the current screen layer having received energy from sputter gas particles may undergo phase segregation, concurrently with application of a planarization treatment to the surface of the current screen layer.

The current screen layer is made up of high resistance areas each comprising an oxide, a nitride, a carbide, or fluoride, and low resistance areas each composed of metal.

With the magnetoresistive device made up as above, parts of the current screen layer, smaller in the film thickness, are metal areas where current is liable to flow with ease, so that the areal resistance RA, and the magnetoresistance ratio can be controlled by controlling the fluctuation in the film thickness. As a result of the fluctuation being formed in the film thickness of the current screen layer, the parts of the current screen layer, smaller in the film thickness, will selectively be the metal areas low in resistance, and the low resistance areas serve as current paths, respectively, so that effects of confining current can be adjusted by controlling the fluctuation in the film thickness, and the magnetoresistive device having a suitable resistance, in combination with a high magnetoresistance ratio, can be implemented under good control by making effective use of spin-dependent scattering.

Further, a magnetic head which shows good performance is obtained by combining the magnetoresistive read head described with an inductive thin-film magnetic write head, or a perpendicular magnetic write head. Furthermore, a magnetoresistive head and magnetic storage apparatus with the magnetic head mounted therein has excellent properties.

According to embodiments of the present invention, there is provided the CPP-GMR head having a high output with a suitable resistance. Further, as a result of reduction in size of depressions and projections, formed in the soft magnetic free layer, it is possible to decrease magnetostatic coupling occurring between the soft magnetic free layer, and the ferromagnetic pinned layer, so that embodiments of the present invention have an advantageous effect of improving magnetic properties of the soft magnetic free layer.

One embodiment of the present invention is cited hereunder by way of example, and is more specifically described with reference to the accompanying drawings.

Embodiment 1

FIG. 1A is a cross-sectional schematic diagram showing a CPP-GMR device of a magnetic head according to Embodiment 1 of the present invention. More specifically, an NiFeCr film (5 nm) as an under layer 112, an MnIr film (6 nm) as an antiferromagnetic layer 113, and a CoFe (3 nm)/Ru (0.8 nm)/CoFe (3 nm) film of a synthetic ferri-magnetic structure as a ferromagnetic pinned layer 114 were formed over a substrate 111. The NiFeCr film used as the under layer was formed to enable the MnIr film (6 nm) of the antiferromagnetic layer to obtain high exchange coupling.

Then, after a Cu film (0.5 nm) as a non-magnetic intermediate layer 115A was formed, an $Al_{90}Cu_{10}$ film (subindices indicate at. %, and the same applies hereinafter) (1.0 nm) as a current screen layer 116 was formed, and subsequently, natural oxidation was applied thereto under a pressure at 500 Pa for one minute. The non-magnetic intermediate layer 115A functions as an anti-oxidizing layer for the pinned layer when the current screen layer is formed. After the current screen layer 116 was formed, etching by reverse sputtering was applied thereto in a vacuum, and by physically shaving the surface of the current screen layer 116, flatness thereof was enhanced. The reverse sputtering was applied under conditions of 15 W for 60 seconds, and an argon flow rate at 12 sccm. Thereafter, a Cu film (0.5 nm) as a non-magnetic intermediate layer 115B for improvement on magnetic properties of a free layer, a CoFe film (3 nm) as a soft magnetic free layer 117, and a Cu (5 nm)/Ru (10 nm) film as a capping layer 118 were sequentially formed. Further, in order to obtain an exchange coupling field of the Mn—Ir film, annealing in a magnetic field at 270° C. was applied for three hours.

Figure 1B:
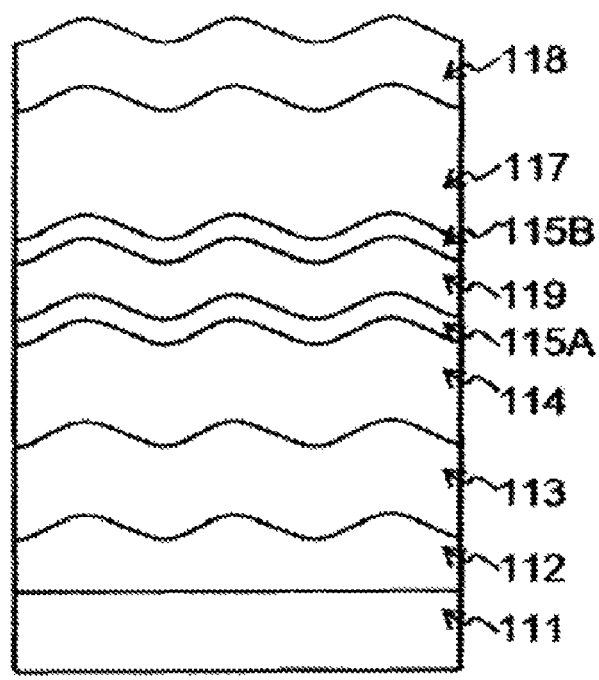
FIG. 1(b) is a schematic diagram showing a conventional CPP-GMR device.

As shown in FIG. 1B, there was concurrently formed a CPP-GMR device where the non-magnetic intermediate layer 115B was deposited over a current screen layer 119 without applying the step of physical etching by the reverse sputtering to the current screen layer 119, as a comparative example.

Now, in the cross-sectional schematic diagram of FIG. 1A, the surfaces of the respective layers from the under layer 112 up to the non-magnetic intermediate layer 115A are shown wavy while the surfaces of the respective layers from the under layer 112 up to the capping layer 118 are shown wavy in a cross-sectional schematic diagram of FIG. 1B. This is due to fluctuations spontaneously occurring in the process of film formation, and films formed under an ordinary condition will have surface roughness on the order of 1.0 nm even if the films each are uniform in thickness due to the fluctuations occurring at the time of film formation.

In manufacturing the CPP-GMR device, no particular consideration has been paid in the past to such waving of the films, spontaneously occurred thereto. However, according to embodiments of the present invention, a planarization treatment for reducing waving is applied to the surface of the current screen layer 116, thereby allowing the current screen layer 116 to have a fluctuation in the film thickness thereof. Further, the films may be formed by selecting a film material and a condition for film formation to thereby cause the underside of the current screen layer to become positively wavy, instead of utilizing the waving of the respective layers, spontaneously occurring in the process of film formation, and thereafter, a planarization treatment may be applied to the surface of the current screen layer 116. For example, a grain size may be increased by use of Cu instead of NiFeCr for the under layer, thereby forming undulation with surface roughness on the order of 2 nm on the underside of the current screen layer.

Figure 2A:
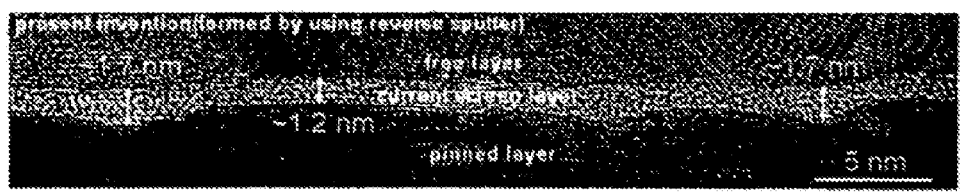
FIG. 2(a) is a cross-sectional TEM photograph of a current screen layer of the CPP-GMR device according to embodiments of the present invention.

FIG. 2A is a cross-sectional TEM photograph of the current screen layer of the CPP-GMR device according to the present invention. The photograph shows that the thickest part of the film is 1.7 nm in thickness while the thinnest part thereof is 1.2 nm, so that a difference in film thickness is 0.5 nm. With the current screen layer 116, an upper interface thereof has surface roughness smaller than surface roughness of a lower interface thereof due to the planarization treatment by use of the reverse sputtering, so that the current screen layer is of a structure having fluctuation in film thickness within the film plane.

Figure 2B:
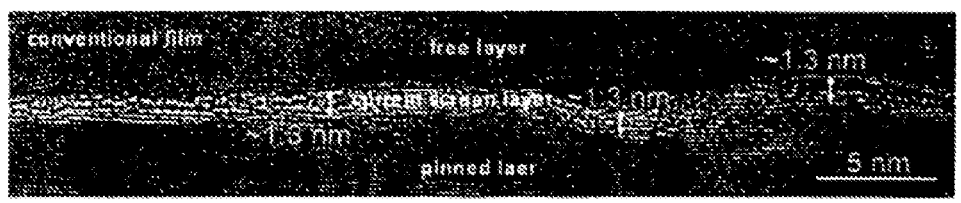
FIG. 2(b) is a cross-sectional TEM photograph of a current screen layer of the conventional CPP-GMR device.

In contrast, with a CPP-GMR device according to the comparative example, formed by a conventional technique, the current screen layer uniform in thickness is formed in such a shape as to match depressions and projections on the under layer, as shown in FIG. 2B. In this case, fluctuation in the film thickness of the current screen layer hardly occurs within the film plane.

With respect to the CPP-GMR device according to embodiments of the present invention, and the CPP-GMR device according to the comparative example, respectively, a relationship between a magnetoresistance ratio and a RA was examined. A CPP-GMR device having the current screen layer was manufactured with the use of a technique according to embodiments of the present invention. Further, a CPP-GMR device having a conventional current screen layer was formed with the use of the same process as that for embodiments of the present invention except that the step of applying a planarization treatment to the surface of the current screen layer was omitted. The devices each had a size falling in a range of 0.3×0.3 µm² to 5.0×5.0 µm², and was formed by use of techniques of ion milling and photolithography. On the basis of size dependence of a device resistance and a device resistance change, a RA, and a resistance area product change ARA were calculated. Specimens of the devices where a film thickness of an $Al_{90}Cu_{10}$ film, before oxidation, was varied in a range of from 0.5 to 2.0 nm were prepared, and electrical properties of the respective devices were measured, whereupon there was obtained dependence of the magnetoresistance ratio (MR ratio), on the resistance area product (RA), shown in FIG. 3. It is evident from the figure that the magnetoresistance ratio of the device formed according to embodiments of the present invention is greater in any RA region as compared with that for the device having the conventional current screen layer.

Figure 4:
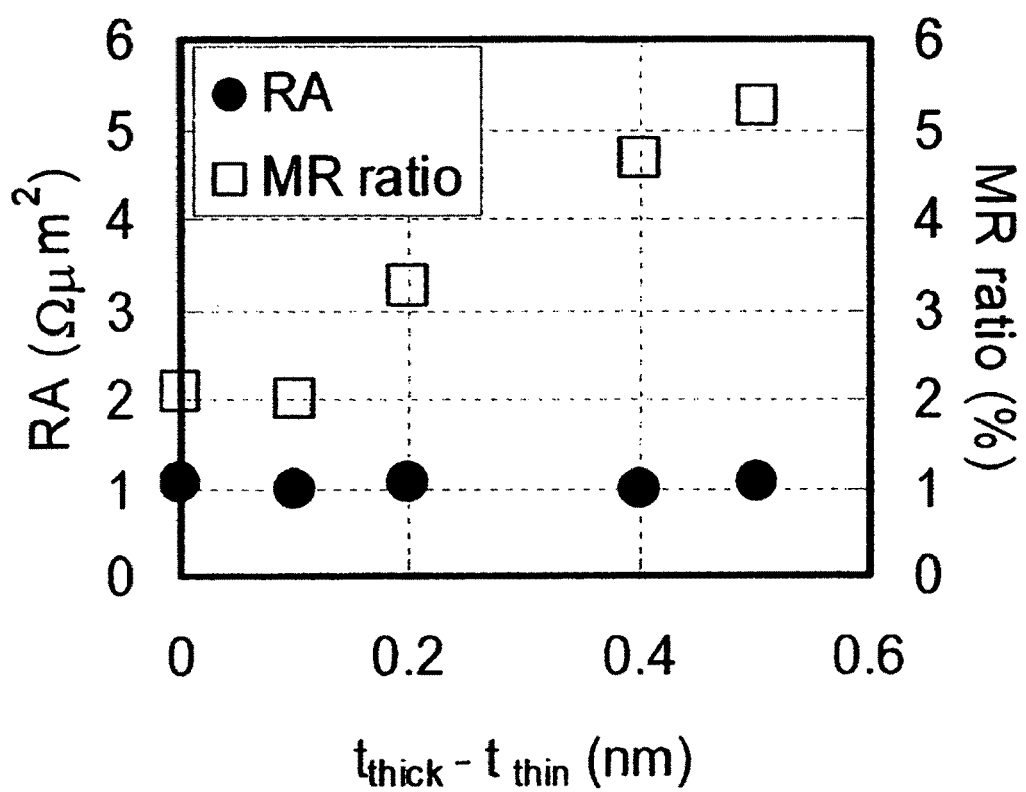
FIG. 4 is a view showing dependence of the RA, and the magnetoresistance ratio, on difference in film thickness.

FIG. 4 is a view showing a graph in which a difference $t_{thick}-t_{thin}$ between a film thickness $t_{thick}$ of the thickest part of the current screen layer, and a film thickness $t_{thin}$ of the thinnest part thereof, after the oxidation, as measured from a cross-sectional TEM image of the CPP-GMR device, is plotted along the horizontal axis while the RA, and the magnetoresistance ratio are plotted along the vertical axis. Results of observation made on the specimens with RA around 1 Ωµm² showed that with respect of all the specimens, the film thickness $t_{thin}$ was found in a range of 1.2±0.1 nm.

It is evident from FIG. 4 that the magnetoresistance ratio increased if the difference in film thickness was greater than 0.2 nm. A range of film thickness distribution attributable to the performance of a sputtering system being on the order of 2 nm, a structure fabricated by a method according to the present invention has the difference in film thickness, greater than range of the film thickness distribution of the sputtering system. That is, it is evident that when the specimens having the RA on the same order are compared with each other, there occurs enhancement in the magnetoresistance ratio in the case of the film thickness of the $Al_{90}Cu_{10}$ film, before the oxidation, being in the range of from 0.5 to 2.0 nm, if the difference $t_{thick}-t_{thin}$ in film thickness is not less than 0.2 nm.

Figure 5A:
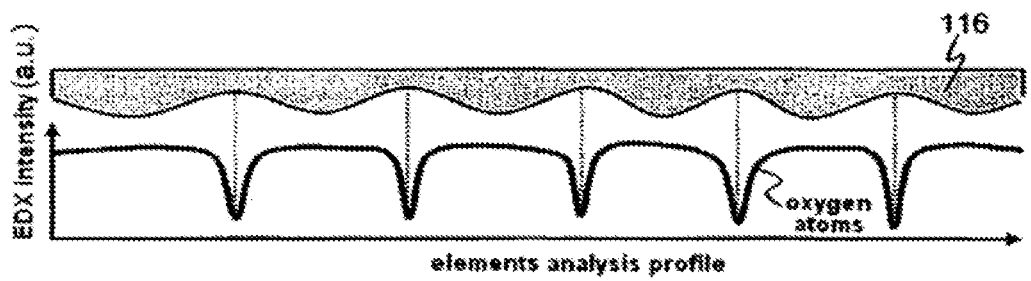

Upon observation on distribution of oxygen concentration by measurement on the cross-sectional TEM image, concurrently with the use of EDX (Energy Dispersion X-ray) in order to check a state of phase segregation inside the current screen layer, there were obtained results resembling schematic diagrams shown in FIG. 5. As shown in FIG. 5A, it is revealed that parts of the current screen layer according to embodiments of the present invention, smaller in film thickness, are low in oxygen content while parts thereof, larger in film thickness, are higher in oxygen content. The current screen layer was found to have a structure where the parts thereof, larger in film thickness, and containing much oxygen, became insulating while the parts thereof, smaller in film thickness, and containing less oxygen, were smaller in resistance, so that current is liable to flow with greater ease in the parts smaller in film thickness. With the current screen layer formed so as to be in such a structure as described, current paths are selectively formed in the parts thereof, smaller in film thickness, and lower in resistance, so that enhancement in the magnetoresistance ratio can be aimed at.

Figure 5B:
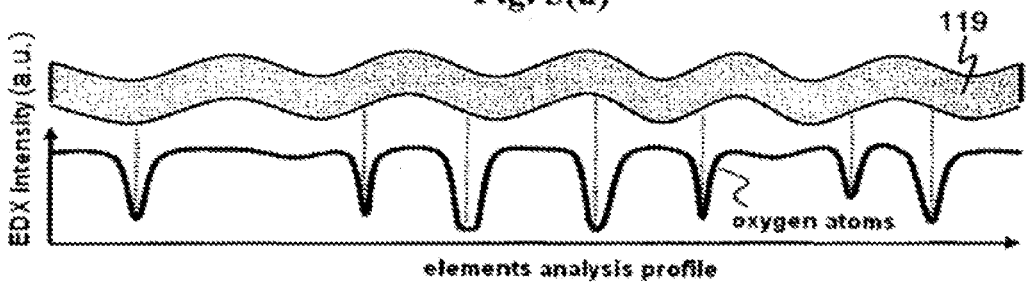

Meanwhile, FIG. 5B shows a schematic diagram indicating results of observation on the conventional current screen layer, with the use of EDX. With the conventional current screen layer, there is not observed definite correspondence between parts thereof, lower in oxygen content, and a cycle of depressions and projections, formed in the film. With the structure described as above, current paths each have a greater resistance as compared with that in the case of embodiments of the present invention, so that the magnetoresistance ratio will be smaller.

With the present embodiment, the NiFeCr film was used for the under layer 112, however, use may be made of any film selected from the group consisting of an NiFe film, an Ru film, a Cu film, and a Ta film, or a multilayered film thereof for the purpose of formation of depressions/projections in the film, enhancement in the exchange coupling field of the antiferromagnetic layer, and so forth. Further, use may be made of a formation where either the non-magnetic intermediate layer 115A functioning as the anti-oxidizing layer for the pinned layer, or the non-magnetic intermediate layer 115B for improvement on the magnetic properties of the free layer is omitted, or a formation where both the non-magnetic intermediate layers 115A, 115B are omitted. Still further, the $Al_{90}Cu_{10}$ film was used as the current screen layer 116, however, the same effect can be obtained even if use is made of a film obtained by oxidizing, nitriding, fluoridizing, or carbonizing an alloy film formed by combining Al, Si, Mg, and so forth with any element selected from the group consisting of Au, Ag, Cu, Pt, Pd, Ru, Rh, Co, Ni, Fe, and so forth. Yet further, the same effect can be obtained even if use is made of a film obtained by oxidizing, nitriding, fluoridizing, or carbonizing a single material film made of any element selected from the group consisting of Ag, Cu, Pt, Pd, Ru, Rh, Co, Ni, Fe, and so forth. Further, use was made of the reverse sputtering as a means for flattening the current screen layer 116, however, the same effect can be obtained even if use is made of IBE whereby ions are injected at a low angle of incidence or GCIB etching.

Embodiment 2 there were prepared specimens of devices where a film thickness before oxidation with respect to the current screen layer 116 in the structure according to embodiments of the present invention, shown in FIG. 1A, and the current screen layer 119 in the conventional structure, shown in FIG. 1B, respectively, was varied in a range of from 0.86 to 1.6 nm. Other layers, and conditions of the reverse sputtering are the same as those for Embodiment 1. In this case, a difference in film thickness, $t_{thick}-t_{thin}$, between the thickest part of the current screen layer of the specimen of the device according to embodiments of the present invention, and the thinnest part $t_{thin}$ thereof was found constant regardless of the film thickness of the current screen layer, that is, $t_{thick}-t_{thin}=0.4$ nm.

In general, at the time of measurement on a magnetization curve of a spin-valve film, a magnetization curve shift Hint is observed against the axis at H=0 (Oe) in the magnetization curve of a free layer. It is desirable from the viewpoint of practical use of a device to make adjustment so that Hint=0 (Oe). Hint is exhibited as the sum of interlayer coupling such as RKKY interaction, and magnetostatic coupling attributable to roughness of an interface.

Figure 6:
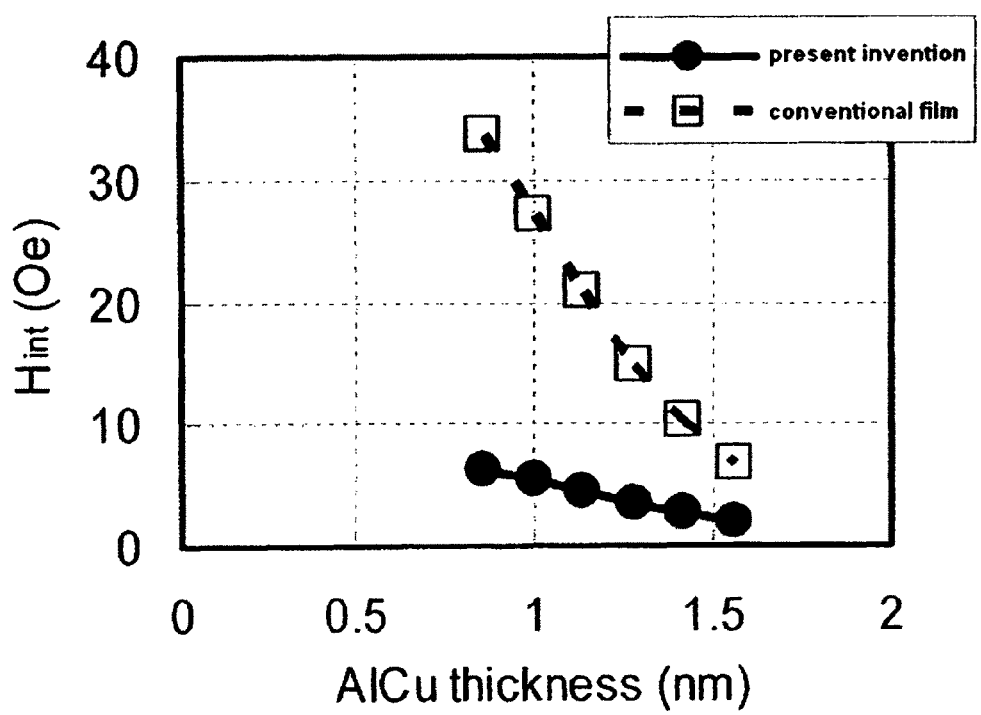
FIG. 6 is a view showing Hint's dependence on an AlCu film thickness.

FIG. 6 is a graph in which a film thickness of the current screen layer is plotted along the horizontal axis, and Hint is plotted along the vertical axis, showing results of the measurement. It is evident from the figure that in the case of the $Al_{90}Cu_{10}$ film with the thickness varied in the range of from 0.86 to 1.6 nm, the static magnetic coupling of the soft magnetic free layer for the specimen of the device where the surface of the current screen layer was flattened by use of the reverse sputtering can be rendered lower than that for the specimen of the device to which the reverse sputtering was not applied.

Figure 7A:
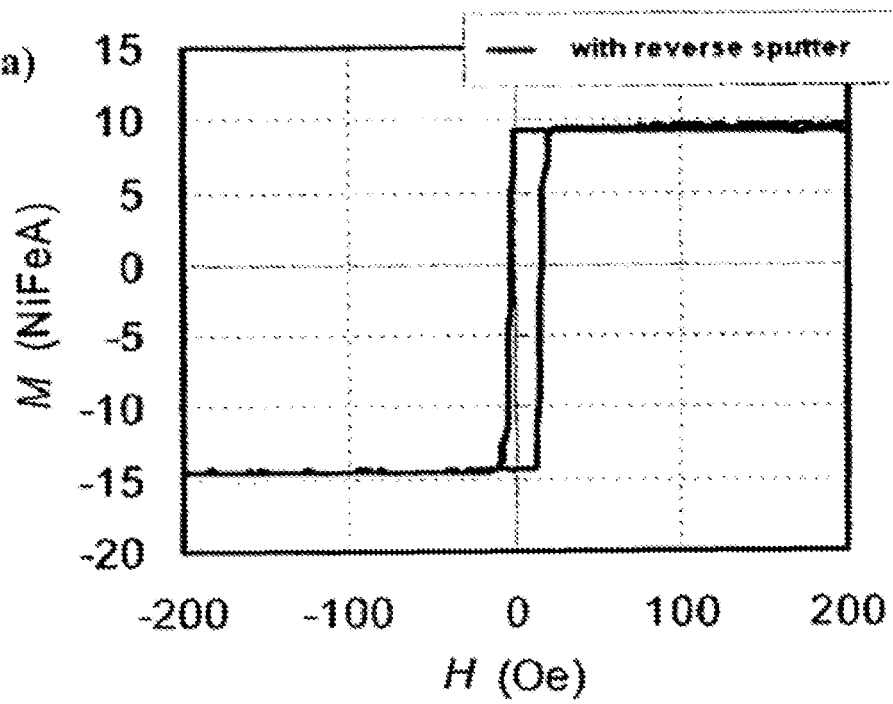
FIGS. 7(a) and 7(b) show graphs indicating magnetization curves of the free layers, in which FIG. 7(a) indicates the magnetization curve of the free layer of the device according to embodiments of the present invention and FIG. 7(b) indicates the magnetization curve of the free layer of the conventional device.
Figure 7B:
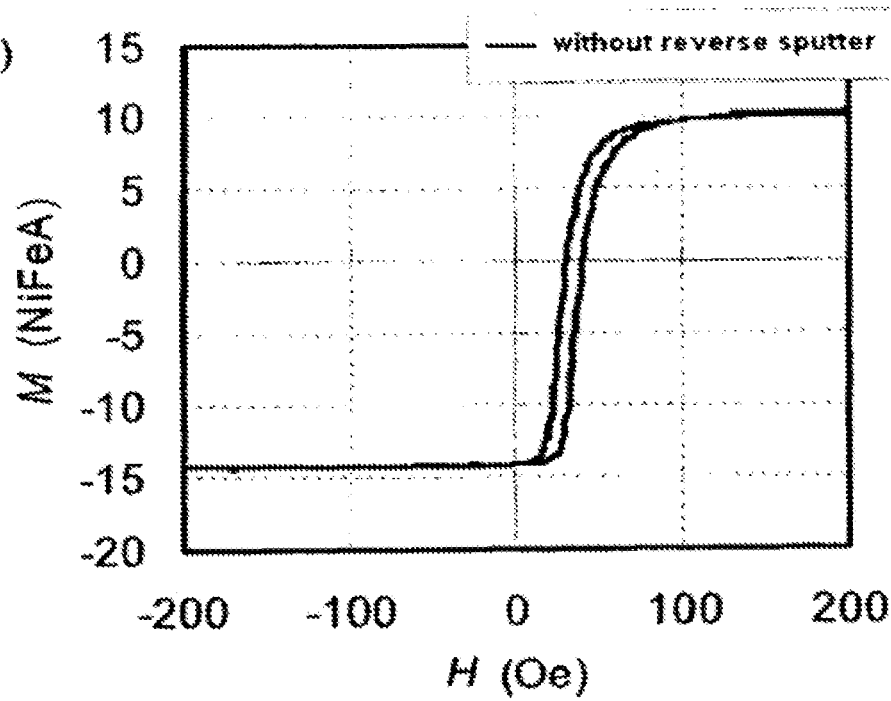

FIG. 7A, and FIG. 7B show results of measurement on respective magnetization curves of the free layers with the use of VSM (Vibrating Sample Magnetometer) in the respective cases where the film thickness of the current screen layer 116 in the structure according to the present invention, shown in FIG. 1A, and the film thickness of the current screen layer 119 in the conventional structure shown in FIG. 1B, before the oxidation, were set to 0.86 nm.

As shown in FIG. 7B, in the case of the magnetization curve of the conventional free layer, Hint was found at 34 Oe, and a squareness ratio was found poor. On the other hand, as shown in FIG. 7A, in the case of the magnetization curve of the free layer according to the present invention, Hint was found at 6 Oe, and a squareness ratio was found proper. The reason for this is presumably because static magnetic coupling between the free layer and the pinned layer decreased due to improvement on the flatness of the current screen layer, and soft magnetic property as well was improved.

From the above, the reverse sputtering is regarded also effective for improvement on the magnetic properties of the free layer.

With the present embodiment, the reverse sputtering is used as the means for flattening the surface of the current screen layer 116, however, the same effect can be obtained even if use is made of IBE whereby ions are injected at a low angle of incidence or GCIB etching.

Embodiment 3

The current screen layer 116 in the structure according to embodiments of the present invention, shown in FIG. 1A, and the current screen layer 119 in the conventional structure shown in FIG. 1B were formed by sputtering in an atmosphere of mixture of argon flowing at 20 sccm, and oxygen flowing at 2 sccm. For a sputter target, use was made of $Al_{90}Cu_{10}$. There were prepared specimens of devices where a film thickness of the current screen layer, after oxidation, was varied in a range of from 0.5 to 2.0 nm. Other layers, and conditions of the reverse sputtering are the same as those for Embodiment 1. In this case, a difference in film thickness, $t_{thick}-t_{thin}$, between the thickest part of the current screen layer 116 of the specimen of the device according to embodiments of the present invention, and the thinnest part $t_{thin}$ thereof was found constant at $t_{thick}-t_{thin}=0.4$ nm regardless of the film thickness of the current screen layer.

Figure 8:
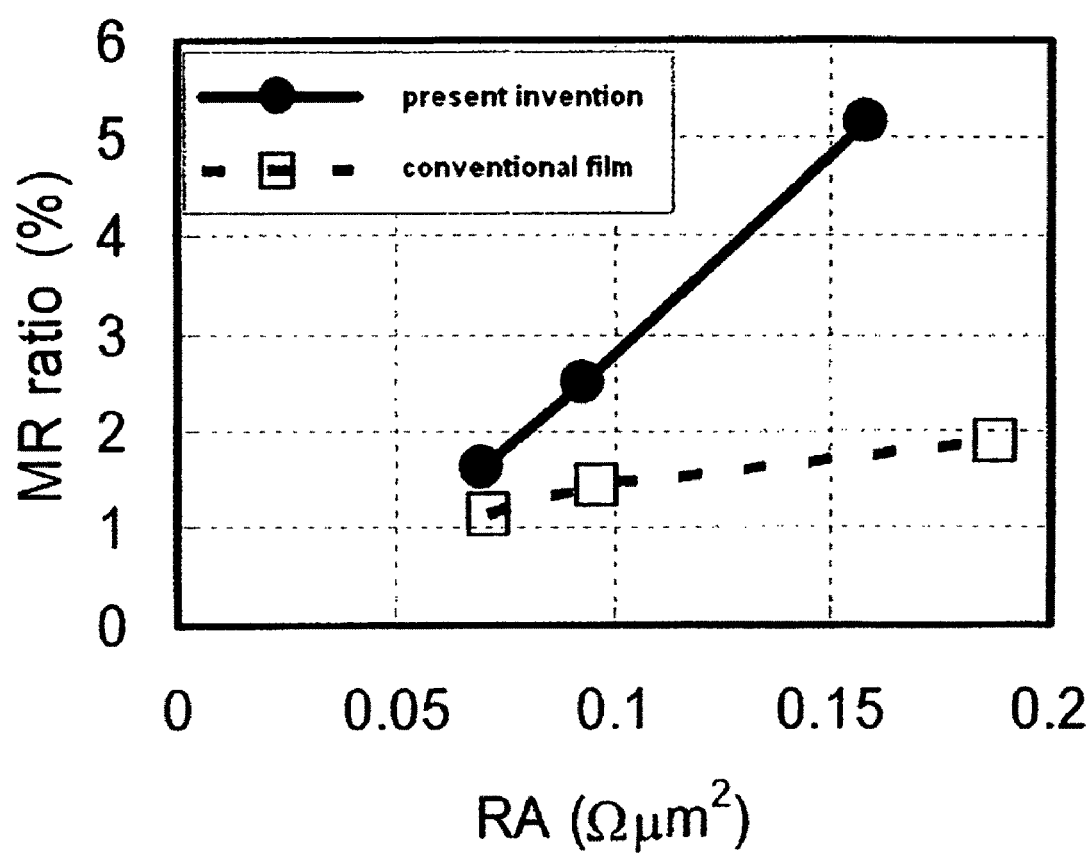
FIG. 8 is view showing a relationship between a magnetoresistance ratio, and a RA of a CPP-GMR device where the current screen layer was formed by sputtering in an atmosphere of mixture of argon, and oxygen.

FIG. 8 shows a relationship between a magnetoresistance ratio, and a RA in the respective cases of the CPP-GMR device according to embodiments of the present invention, with the current screen layer formed by use of such a method as described, and the conventional CPP-GMR device with the current screen layer formed by use of the method described. It is evident from FIG. 8 that the magnetoresistance ratio of the device according to the present invention, where a fluctuation was provided in the film thickness of the current screen layer by flattening the surface thereof, is greater in any RA region as compared with that for the conventional device where the current screen layer is uniform in film thickness.

With the present embodiment, an oxygen flow rate was set to 2 sccm. However, the same results were obtained in that the magnetoresistance ratio of the device according to embodiments of the present invention became greater than that for the conventional device although the higher the flow rate, the higher RA was liable to become with the oxygen flow rate even in a range of 1 to 10 sccm.

Embodiment 4

The current screen layer 116 in the structure according to embodiments of the present invention, shown in FIG. 1A, and the current screen layer 119 in the conventional structure shown in FIG. 1B were formed by sputtering in an atmosphere of mixture of argon flowing at 20 sccm, and nitrogen flowing at 6 sccm. For a sputter target, use was made of $Al_{90}Cu_{10}$. There were prepared specimens of devices where a film thickness of the current screen layer, after nitriding, was varied in a range of from 0.6 to 2.0 nm. Other layers, and conditions of the reverse sputtering were the same as those for Embodiment 1. In this case, a difference in film thickness between the thickest part of the current screen layer 116 of the specimen of the device according to embodiments of the present invention, and the thinnest part $t_{thin}$ thereof was found constant at $t_{thick}-t_{thin}=0.3$ nm regardless of the film thickness of the current screen layer.

Figure 9:
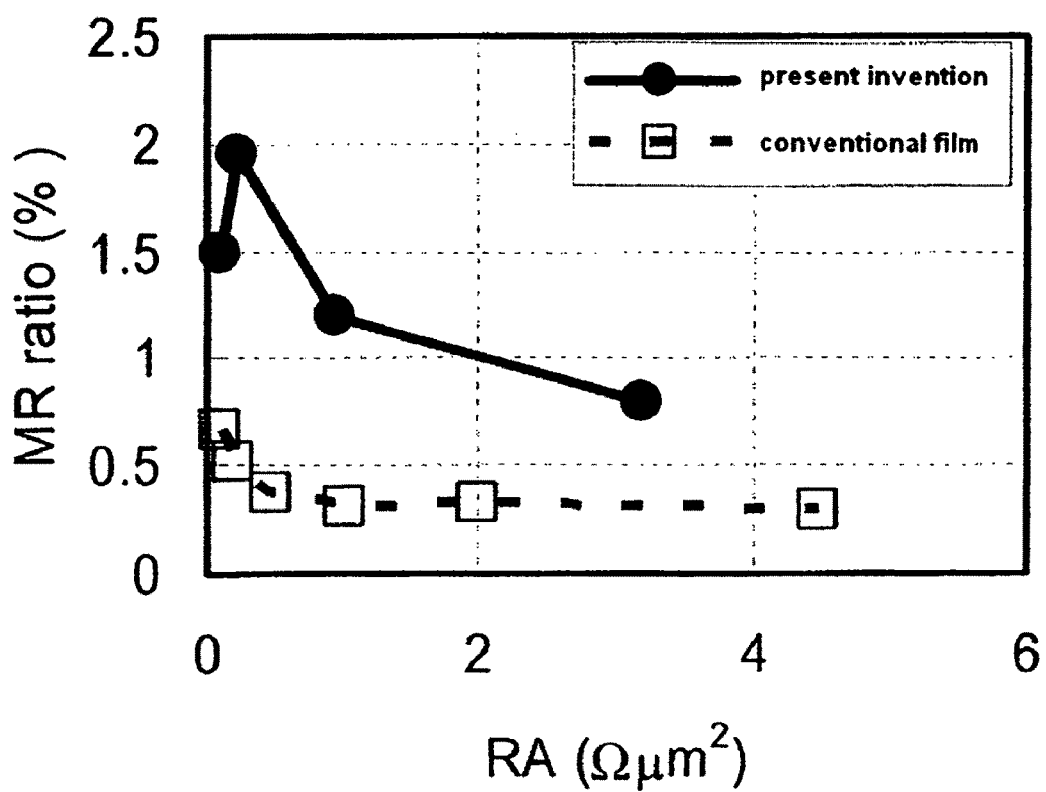
FIG. 9 is view showing a relationship between a magnetoresistance ratio, and a RA of a CPP-GMR device where the current screen layer was formed by sputtering in an atmosphere of mixture of argon, and nitrogen.

FIG. 9 shows a relationship between a magnetoresistance ratio, and a RA in the respective cases of the CPP-GMR device according to embodiments of the present invention, with the current screen layer formed by use of such a method as described, and the conventional CPP-GMR device with the current screen layer formed by use of the method described. It is evident from FIG. 9 that the magnetoresistance ratio of the device according to embodiments of the present invention is greater in any RA region as compared with that for the conventional device.

With the present embodiment, an nitrogen flow rate was set to 6 sccm, however, the same results were obtained with the nitrogen flow rate even in a range of 4 to 10 sccm.

Embodiment 5

Figure 10:
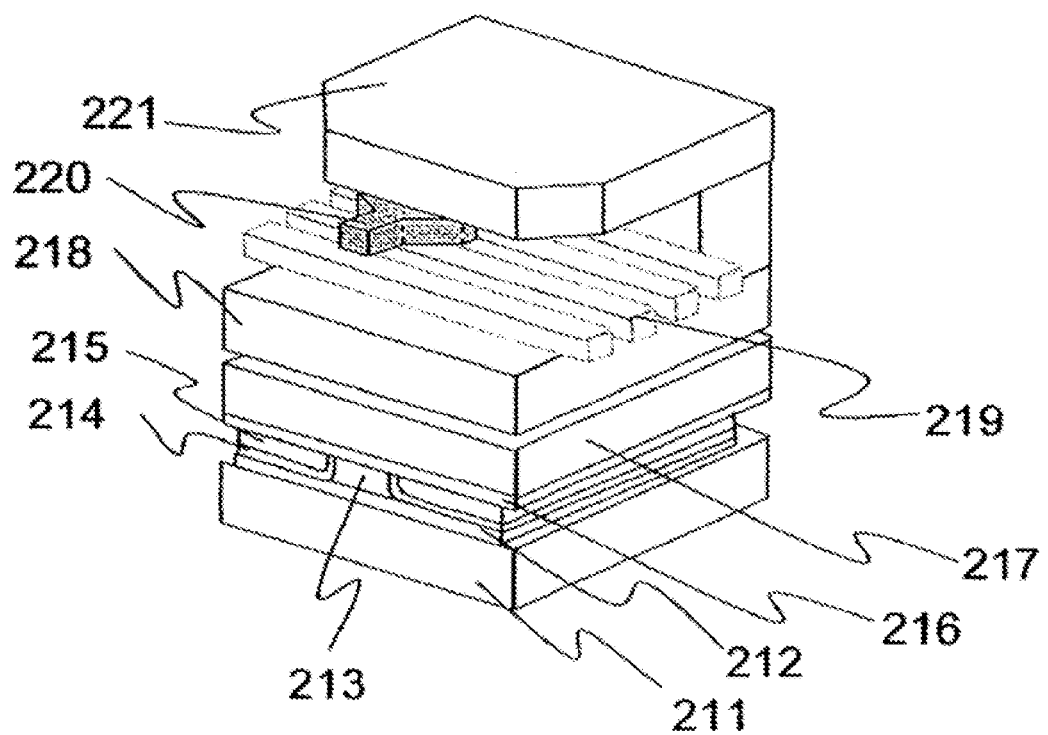
FIG. 10 is a conceptual view of a magnetic head composed of a perpendicular magnetic recording head and a read head.

FIG. 10 is a conceptual view of a magnetic head composed of a perpendicular magnetic recording head and a read head, incorporating the magnetoresistive device according to embodiments of the present invention. The read head comprises a lower first shield 211 formed over a substrate, doubling as a slider, a second shield 212, a CPP-GMR film 213 having a current screen layer, an insulator gap film 214, a magnetic domain control film 215, an electrically conductive gap film 216, and an upper shield 217. The perpendicular magnetic recording head comprising a return pole 218, coils 219, a main pole 220, and a yoke 221 is provided on the upper side of the read head.

Since embodiments of the present invention are concerned with the read head, according to embodiments of present invention, the read head may be combined with a recording head on a write head side of the magnetic head, regardless of whether the recording head is the perpendicular magnetic recording head or a longitudinal recording head. However, the read head according to embodiments of the present invention is able to exhibit a more effective function when the same is combined with the perpendicular magnetic recording head.

Embodiment 6

Figure 11A:
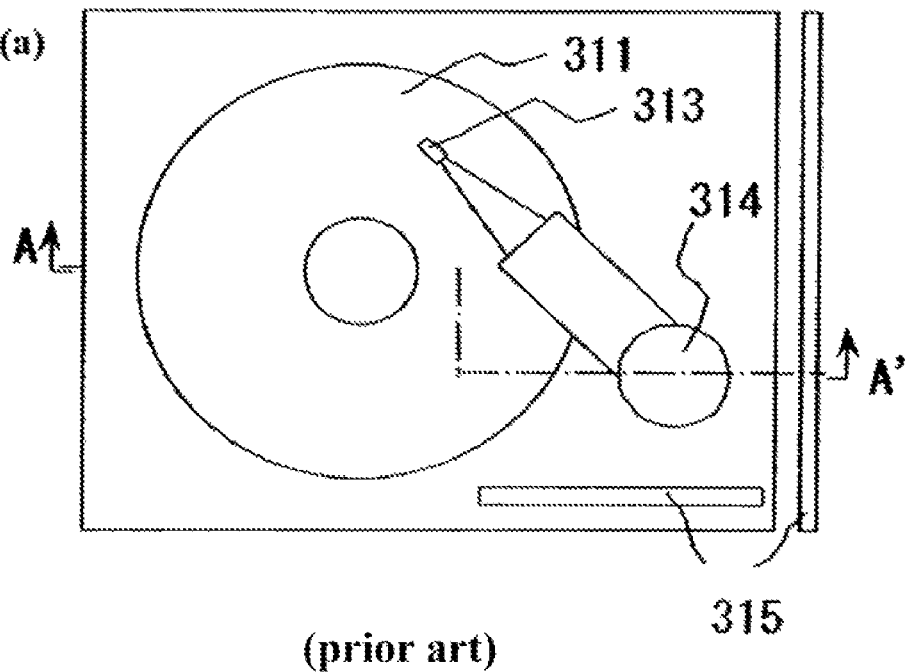
Figure 11B:
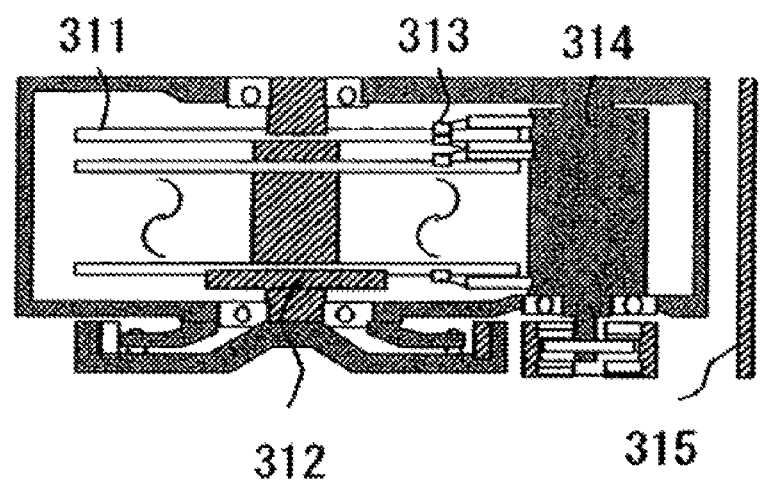

A hard disk drive using the magnetic head comprising the perpendicular magnetic recording head and the read head, according to Embodiment 5, was constructured. FIG. 11A is a plan schematic diagram of the hard disk drive, and FIG. 11B is a sectional schematic diagram of the hard disk drive, taken on line A-A of FIG. 11A. For a magnetic disk 311, use was made of granular media for perpendicular recording, composed of CoCrPt, and $SiO_2$. For a magnetic head 313, use was made of the magnetic head according to Embodiment 5. The magnetic disk 311 for magnetically recording information is rotated by a spindle motor 312, and the magnetic disk 311 is guided over tracks of the magnetic disk 311 by an actuator 314. More specifically, with the hard disk drive, the read head, and the write head, placed on the magnetic disk 311, are caused to approach a predetermined recording position to make a relative motion by virtue of this mechanism, thereby sequentially writing, and reading a signal. A recording signal is recorded on the magnetic disk by the write head via a signal processing system 315, and an output of the read head is obtained as a signal via the signal processing system 315.

Tests were conducted on the magnetic head according to embodiments of the present invention, and a magnetoresistive head and magnetic storage apparatus incorporating the same, made up as described in the foregoing, and results of the tests indicated a sufficient output, and excellent bias characteristics. Further, reliability of operation was found excellent. The reason for this is because it was possible to obtain a high magnetoresistance ratio at a low RA by applying the CPP-GMR film having the current screen layer according to embodiments of the present invention to the read head.

What is claimed is:

1. A magnetic head comprising:
a pinned layer;
a free layer; and
a current screen layer for confining current therein and having a first part with a thickness greater than a thickness of a second part, a direction of the thicknesses of the first and second parts in a direction normal to a film plane, the current screen layer configured to pass a sense current substantially perpendicular to the film plane, wherein the current screen layer has a planar surface and a wavy surface opposite the planar surface in the direction normal to the film plane.

2. The magnetic head according to claim 1, wherein the current screen layer comprises:
high resistance areas comprising an oxide, a nitride, a fluoride, or a carbide; and
low resistance areas configured to exhibit an electrical resistance that is lower relative to the high resistance areas.

3. The magnetic head according to claim 1, wherein the second part is configured to exhibit an electrical resistance that is lower relative to the first part.

4. The magnetic head according to claim 1, wherein the current screen layer is formed between the pinned layer and the free layer.

5. The magnetic head according to claim 4, wherein a non-magnetic intermediate layer is provided between the pinned layer and the current screen layer.

6. The magnetic head according to claim 4, wherein a non-magnetic intermediate layer is provided between the current screen layer and the free layer.

7. The magnetic head according to claim 1, wherein $t_{thick}-t_{thin}>0.2$ nm provided that a film thickness of the first part of the current screen layer is defined as $t_{thick}$, and a film thickness of the second part of the current screen layer is defined as $t_{thin}$.

8. The magnetic head according to claim 1, further comprising a write head provided with magnetic poles and coils.

9. A magnetoresistive head and magnetic storage apparatus comprising:
- a magnetic disk;
- a drive means for rotating said magnetic disk;
- a magnetic head for executing recording operation and reading operation against said magnetic disk; and
- a head driver for executing positioning of said magnetic head over said magnetic disk,
- wherein said magnetic head includes:
- a pinned layer;
- a free layer; and
- a current screen layer for confining current therein and having a first part exhibiting a thickness greater than a thickness of a second part, a direction of the thickness of the first and second parts in a direction normal to a film plane,
- wherein the current screen layer has a planar surface and a wavy surface opposite the planar surface in the direction normal to the film plane, and
- wherein the current screen layer is configured to pass a sense current in a direction substantially perpendicular to the film plane.

10. The magnetic head according to claim 1, further comprising:
- a first non-magnetic intermediate layer positioned between the pinned layer and the current screen layer;
- a second non-magnetic intermediate layer positioned between the current screen layer and the free layer,
- wherein the current screen layer is positioned between the pinned layer and the free layer, and
- wherein $t_{thick}-t_{thin}>0.2$ nm provided that a film thickness of the first part of the current screen layer is defined as $t_{thick}$, and a film thickness of the second part of the current screen layer is defined as $t_{thin}$.

* * * * *